(12) United States Patent
Mole et al.

(10) Patent No.: US 6,226,509 B1
(45) Date of Patent: May 1, 2001

(54) IMAGE REJECT MIXER, CIRCUIT, AND METHOD FOR IMAGE REJECTION

(75) Inventors: Peter John Mole, St Albans; Henric Van Vliet, Dormansland; Chettan Babla, Rushey Mead, all of (GB)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/152,838

(22) Filed: Sep. 15, 1998

(51) Int. Cl.[7] ............................. H04B 1/10; H04B 1/26
(52) U.S. Cl. ...................... 455/302; 455/326; 455/333; 455/311; 455/307
(58) Field of Search ........................... 455/302, 326, 455/333, 311, 324, 307; 327/356, 355; 375/319

(56) References Cited

U.S. PATENT DOCUMENTS

| | | | |
|---|---|---|---|
| 4,457,022 | * 6/1984 | Dydyk | 455/302 |
| 4,584,715 | * 4/1986 | Baars et al. | 455/302 |
| 5,033,110 | * 7/1991 | Harman | 455/302 |
| 5,140,198 | * 8/1992 | Atherly et al. | 455/302 |
| 5,448,772 | * 9/1995 | Grandfield | 455/326 |
| 5,548,244 | * 8/1996 | Clewer | 455/315 |
| 5,809,410 | * 9/1998 | Stuebing et al. | 455/326 |
| 5,826,182 | * 10/1998 | Gilbert | 455/326 |
| 5,870,670 | * 2/1999 | Ripley et al. | 455/324 |
| 5,937,341 | * 8/1999 | Suominen | 455/324 |
| 5,950,119 | * 9/1999 | McGeehan et al. | 455/302 |
| 5,974,306 | * 10/1999 | Hornak et al. | 455/302 |
| 5,999,804 | * 12/1999 | Forgues | 455/326 |
| 6,006,081 | * 12/1999 | Moore | 455/326 |
| 6,029,059 | * 2/2000 | Bojer | 455/326 |
| 6,137,999 | * 10/2000 | Lovelace et al. | 455/302 |

OTHER PUBLICATIONS

Jan Crols and Michiel Steyaert, "An Analog Integrated Polyphase Filter for a High Performance Low–IF Receiver", 1995 Symposium on VLSI Circuits Digest of Technical Papers, Jun. 1995, pp. 87 and 88.*

Jan Crols and Michiel Steyaert, "Low–IF Topologies for High Performance Analog Front Ends of Fully Integrated Receivers", IEEE Transactions on Circuits and Systems–II: Analog and Digital Signal Processing, vol. 45, No. 3, Mar. 1998, pp. 269–282.*

IEEE Journal of Solid State Circuits, vol. 30, No. 12, p 1483–1492 A Single–Chip 900 MHz CMOS Receiver Front–End with a High Performance Low–IF Topology by Jan Crols and Michel Steyaert.

* cited by examiner

Primary Examiner—Edward F. Urban
Assistant Examiner—Rafael Perez-Gutierrez
(74) Attorney, Agent, or Firm—Lee, Mann, Smith, McWilliams, Sweeney & Ohlson (57) ABSTRACT

To reduce the impact of image frequencies generated by mixing an incident carrier signal down to a relatively low intermediate frequency signal used in subsequent signal processing, a mixing frequency is selected such that the generated intermediate frequency signal has a frequency offset relative to DC that is substantially that of a single channel spacing between frequency adjacent incident carrier signals, as shown in FIG. 2. Image rejection is further improved through the integration of a current-driven polyphase filter (36) directly between an input stage (Q1 to Q4) and a mixer stage (Q5 to Q12) of an image reject mixer (FIG. 4) such as to mitigate quadrature divergence between separate in-phase and quadrature paths within the image reject mixer.

33 Claims, 6 Drawing Sheets

IMAGE REJECT MIXER, CIRCUIT, AND METHOD FOR IMAGE REJECTION

BACKGROUND OF THE INVENTION

This invention relates, in general, to a circuit and operating method for image rejection and also to the configuration of an image reject mixer. More particularly, but not exclusively, the invention is applicable to integrated circuit technology for a radio communication device, such as a Digital Enhanced Cordless Telecommunication (DECT) chip-set.

SUMMARY OF THE PRIOR ART

With an increasing demand by the general public for smaller and more ergonomic designs, telecommunication equipment (and particularly subscriber/handset) manufacturers have sought higher levels of functional integration within their respective integrated circuit (IC) designs. Indeed, subscriber terminals, for example, can now be realized through the use of as little as two ICs (which are sometimes referred to as "chips"). However, in order to achieve this level of integration, manufacturers' have had to develop improved circuitry that consumes relatively low amounts of power (typically driven by a voltage at or below approximately 3.3 volts) and which circuitry is optimized in terms of both configuration and power dissipation.

As will be understood, the term "subscriber terminal" is generic and encompasses transceiver, transmitter and receiver equipment, while such equipment can operate in wireline, radio frequency (RF) or optical environments. Indeed, the various architectures referred to above can be realized using either analog or digital techniques.

As will be readily understood in relation to general communication theory, a carrier signal is in some way modulated by an information-bearing signal in order to support information transfer. In a radio frequency environment, for example, many different forms of modulation exist, such as Gaussian minimum shift keying (GMSK) that utilizes phase modulation (through in-phase and quadrature components) or orthogonal frequency division multiplexing (OFDM) in which a composite signal envelope is created from a multiplicity of sub-channel carriers using, for example, frequency modulation techniques. Modulation of the information-bearing signal onto the carrier signal has the effect of producing a channel having a finite bandwidth that is related to the rate of transmission of information according to Nyquist's theorem. In other words, a modulated radio signal contains its information in a range of frequencies distributed about a central carrier (or channel) frequency.

In all cases, the carrier signal is within a stipulated frequency range for a particular form of transmission, e.g. downlink and uplink transmissions in the Global System for Mobile (GSM) communication each have an allocated band within the range of 935 MHz to 960 MHz while the uplink and downlink bands support respective duplex channel pairs that are separated by a 45 MHz spacing.

With respect to the reception and subsequent demodulation of an RF signal, for example, there are presently two lines of thought. First, the RF signal can be directly mixed down to a zero intermediate frequency (IF) where the carrier signal is located at dc. However, any dc offsets (and, in particular, time varying dc offsets) that occur at the output of a mixer appear as part of the signal, such dc offsets therefore have the unwanted effect of corrupting data integrity. Unfortunately, these dc offsets cannot be filtered out without removing wanted information in the RF signal. Consequently, the sensitivity of a receiver is limited by the level of the dc offsets.

Mixing straight down to dc, however, has many advantages since both filtering with low pass filters at dc and digitizing the signal is much easier than at higher frequencies.

The accepted but alternative line of thought with respect to information recovery from a modulated carrier involves the generation and use of an intermediate frequency (IF) signal from the RF signal; the IF signal, whilst being at reduced frequency relative to the carrier, still has a relatively large frequency displacement with respect to baseband (dc). The problem with the use of such an intermediate frequency is that the wanted signal at the relatively low IF can be very easily confused with its image signal. More specifically, prior to further down mixing to baseband, the wanted signal sits above the local oscillator by the relatively low intermediate frequency, whilst an image signal sits below the local oscillator by the same amount. On down mixing, in general, the image frequency is translated to a negative frequency, which negative frequency can only be distinguished from a positive frequency using a quadrature mixer in which the degree of resolution is limited by the accuracy of the quadrature mixer. Consequently, the use of an intermediate frequency can result in the incorrect interpretation of data, while elimination of any associated uncertainty is achievable at the cost of the provision of a more accurate quadrature mixer.

For complete understanding, it should be appreciated that the term "negative frequency" relates to the direction of rotation of a phasor (vector) used to generate a time domain data from frequency domain data, while it will be understood that the term "frequency" is the rate of change of phase. More particularly, once the initial phase and amplitude of a carrier are determined, the sign of the frequency determines whether the phasor rotates in a clockwise or counter-clockwise rotation, and hence whether the frequency is positive or negative.

In a communication system, the amplitude of the wanted frequency that is recovered is often relatively small (as a consequence of normal propagation losses), while a received interferer at the image frequency has significantly larger amplitude. In this respect and as will be appreciated, the choice of IF is critical in coping with the presence of such an interferer.

Specifically, if a zero IF is used then the wanted signal is its own image. Since the image and the wanted are therefore at the same power level it is only necessary to reject the image by enough to ensure the wanted signal can be cleanly demodulated. Quadrature mixers offering thirty decibels (30 dB) of image rejection are quite sufficient for this.

If a higher IF is used, then the wanted and image signals may be separated by sufficient frequency (before mixing) to allow the image signal to be attenuated by filtering before mixing. In other words, to allow effective filtering of the image signal, present systems select the IF signal to ensure that the difference frequency (or 2*IF) facilitates filtering, i.e. a distinguishable frequency separation exists between the image signal and the frequency envelope of the wanted signal. In fact, to ensure the filtering can be achieved, the IF needs to be a reasonable fraction of a frequency of the local oscillator (LO). In practice, this means that for digital radios with RF frequencies around 1 GHz (gigaHertz), the IF is currently of such a high frequency that it cannot be simply digitized or filtered. Clearly, the sum component of the IF and the RF signal is easily filterable since it is above the RF band.

If the IF is too low, then it is impossible to filter the image whilst the signals are at RF. Thus, the image signal must be restricted to be no greater than the level which an image reject mixer can sufficiently suppress. Clearly, however, the level of suppression is somewhat dependent upon the configuration and type of components (and the manufacturing techniques) employed to construct the image rejection mixer and/or filter and so improved performance can usually be attained through increased manufacturing costs. However, such increases in cost may render a product commercially non-viable and so performance of the product is therefore often compromised.

In digital radio systems, it is only those high amplitude signals (i.e. high level interferers) that are close to the wanted signal that cannot be rejected. Moreover, even in such digital systems, imperfections in conventional filtering and phase noise in local oscillators prevent effective rejection of high level interferers.

Telecommunication standards do, however, require strict compliance to acceptable equipment performance and, in this respect, manufacturers have, to date, opted for a relatively high intermediate frequency in order to reduce manufacturing costs.

The DECT system specification requires detection of a wanted signal at −73 dBm in instances when interferers in the neighbouring channel and next neighbouring channel have power levels of −60 dBm and −39 dBm, respectively. Similar specifications exist in other communication system.

In summary, the use of a zero IF has DC offset problems, while the alternative use of a higher intermediate frequencies imposes increased processing requirements on analog-to-digital (A/D) converts and digital signal processors (DSPs) that exceed the specifications of components that can be obtained readily and at low-cost.

In relation to a conventional image reject mixer, such a device relies on splitting the RF signals between two mixer chains. More specifically, in-phase and quadrature signals are generated from a local oscillator reference and then respectively applied to the discrete mixer chains, i.e. one mixer is driven by the in phase local oscillator signal and the other by the quadrature signal. After a suitable phase rotation (by ninety degrees) to re-align the two signals in the different chains, a resultant IF signal is then obtained by recombination of the phase aligned signals. The quality of the image rejection is critically dependent on providing good quadrature at the local oscillator, providing gain matching of the two mixers and providing gain matched phase rotation at the IF. As will be appreciated, it is critical to provide accurate local oscillator quadrature since any variation in generated phase angle effectively introduces a delay into the path of the signal that is detrimental to information recovery. For example, for a local oscillator producing a 2 GHz reference, a one degree deviation from ninety degrees corresponds to a delay between the signals of only 1.4 ps (pico seconds) which is equivalent to the delay introduced by 0.5 mm (millimetres) of signal path in air. To date, therefore, the image reject mixer requires a relatively expensive precision integrated LO quadrature generator.

SUMMARY OF THE INVENTION

According to a first aspect of the present invention there is provided an integrated image reject mixer circuit responsive to an information-bearing signal and arranged to be coupled to a local oscillator that provides phase-referenced signals thereto and wherein the information-bearing signal has in-phase and quadrature components, the integrated image reject mixer circuit comprising: circuit arrangements of first, second, third and fourth mixer paths each containing: a signal input for receiving the information-bearing signal; a mirrored pair of mixer transistors for receiving selected phase-referenced signals, each mirrored pair of mixer transistors further configured to receive a dedicated phase aligned information-bearing signal for frequency down conversion to a respective intermediate frequency component through mixing with one of the selected phase-referenced signals; and a polyphase filter integrally formed directly between the signal inputs and the mirrored pairs of mixer transistors of each of the first, second, third and fourth mixer paths such that the phase aligned information-bearing signals in each of the respective first, second, third and fourth mixer paths are generated within each mixer path and have a substantially quadrature phase shift therebetween.

Preferably, the phase-referenced signal applied to each mirrored pair of mixer transistors has a frequency such that mixing with the information-bearing signal forms an intermediate frequency signal having a frequency offset relative to DC that is in an approximate range of between a half channel spacing and a single channel spacing.

Beneficially, integration of the polyphase filter can be achieved with an overall reduction in the number of components in view (particularly) of the elimination of the requirement to provide discrete buffering components and the advantage that the polyphase filter and the image reject mixer can be current driven (without imposing an increased drain on any available power source, such as a battery). Furthermore, quadrature between each mixer path is therefore improved by direct integration of the polyphase filter, especially in view of the improved component matching achieved within the circuit.

In a second aspect of the present invention there is provided a method of improving quadrature in an integrated image reject mixer circuit containing a plurality of mixer paths each containing a signal input directly coupled directly through a polyphase filter to a multiplexing mixer, the method comprising the steps of: generating phase-referenced signals for use in each multiplexing mixer; receiving an information-bearing signal supporting in-phase and quadrature components and selectively applying the in-phase and quadrature components to assigned ones of said mixer paths to a respective signal input; phase aligning the information-bearing signal applied to each mixer path in the polyphase filter such that each mixer path has a substantially quadrature phase shift therebetween; and frequency down converting said phase aligned information-bearing signals to generate an intermediate frequency component through mixing with the phase-referenced signals in the mixer.

In a further aspect of the present invention there is provided a method of rejecting image frequencies in a receiver responsive to a plurality of channel resources each having a relatively high frequency carrier and in which each of said plurality of channel resources is separated from an adjacent channel resource by a channel spacing, the method comprising the steps of: generating and applying a mixing frequency to down convert the relatively high frequency carrier to an intermediate frequency having a frequency offset relative to DC that is in an approximate range of between a half channel spacing and a single channel spacing.

In another aspect of the present invention there is provided an integrated circuit for a radio receiver responsive to a plurality of channel resources of a communication system, each of the plurality of channel resources having a relatively high frequency carrier modulated by an information-bearing signal and wherein each of said plurality of channel resources is separated from an adjacent channel resource by a single channel spacing, the integrated circuit containing: a frequency generator providing a reference frequency; and a mixer responsive to the plurality of channel resources and the frequency generator, the mixer arranged to combine the reference frequency with a desired channel resource of said plurality of channel resources to form an intermediate frequency signal having a frequency offset relative to DC that is in an approximate range of between a half channel spacing and said single channel spacing and such that image frequencies lie within control bands of the communication system.

Advantageously, the use of a unitary or (half) channel offset from dc for the IF removes the dc offset problems associated with a zero IF whilst maintaining the receivers ability to benefit from digital processing, including digital filtering. Moreover, use on a unitary channel spacing (particularly) ensures that the image signal lies close to the wanted signal (i.e. in the same system band) but in a frequency domain that allows rejection of a (very) powerful interferer at the image frequency while also reducing the complexity required for subsequent A/D signal conversion.

In yet another aspect of the present invention there is provided a biasing circuit for providing an incident information-bearing signal to a plurality of paths in an image reject mixer, the biasing circuit comprising: a signal input for receiving the information-bearing signal; an in-phase output coupled to the signal input through a first capacitor of relatively low capacitance, the in-phase output further coupled to a voltage reference point through a first resistor of relatively low resistance; a quadrature output coupled to the signal input through a second resistor nominally having the relatively low resistance, the quadrature output further coupled to the voltage reference point through a second capacitor nominally having the relatively low capacitance; and a biasing voltage generator providing a biasing voltage to the in-phase output and the quadrature output via, respectively, third and fourth resistors coupled directly in series to the first resistor and the second resistor, respectively, and wherein the third and fourth resistors have a relatively high resistance; whereby the biasing circuit isolates the plurality of paths in the image reject mixer and supports AC coupling and quadrature splitting of the information-bearing signal from a low impedance source.

BRIEF DESCRIPTION OF THE DRAWINGS

Exemplary embodiments of the present invention will now be described with reference to the accompanying drawings, in which.

DETAILED DESCRIPTION OF A PREFERRED EMBODIMENT

The first aspect of the present invention has recognized that dc offsets can be made to fall outside the signal bandwidth and can be removed by a high pass filter provided that the modulated RF signal is mixed down to a quasi-zero IF. More particularly, it has been realized that selection of an IF close to DC can ensure that the image lies within the control bands of the frequency plan, i.e. the power of the image signal is limited.

Figure 1:
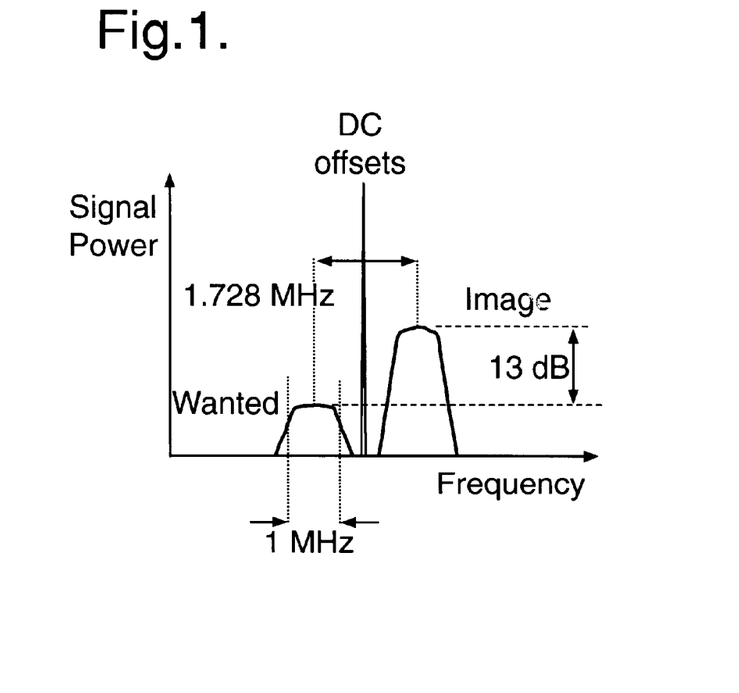
FIG. 1 is a frequency domain representation indicating the effects of the selection of an intermediate frequency close to DC, according to a first embodiment of the first aspect of the present invention.

In a first embodiment of the present invention, the image is located in the neighbouring channel through the selection of an intermediate frequency that is one half the channel spacing of the telecommunication system (e.g. in DECT, the IF would therefore be selected as 0.5*1.728 MHz, namely at a frequency of 0.864 MHz). DC offsets then sit in the narrow guard band between the wanted channel and its neighbour. An image rejection of 13 dB then reduces the image to the same level as the wanted signal, although a further margin must be allowed to enable low error detection of the signal; this is generally illustrated in FIG. 1.

Figure 2:
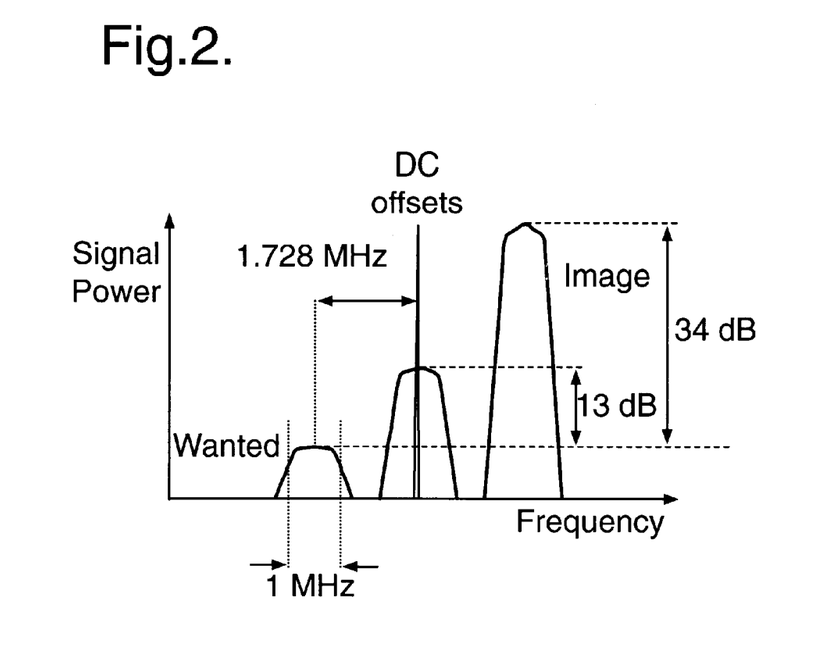
FIG. 2 is a frequency domain representation indicating the effects of the selection of an intermediate frequency close to DC, according to a second embodiment of the first aspect of the present invention.

In a second embodiment of the present invention, the IF is selected such that the image falls in the next but one neighbour, i.e. the IF is selected to have unitary channel spacing from dc (e.g. the IF is 1.728 MHz in DECT). The dc offsets then sit on the neighbouring channel and will be removed by conventional channel filtering. An image rejection of 34 dB reduces the image to the same level as the wanted signal, although a further margin must be allowed to enable low error detection of the signal; this is generally illustrated in FIG. 2.

Selection of a one channel offset from dc for the IF is particularly beneficial in relation to the set-up of the synthesizer since key frequencies are all integer multiples thereof. Moreover, digital signal processing is simplified by virtue of the fact that information is kept relative to the base IF frequency (of 1.728 MHz in the specific example of DECT). Indeed, from a demodulation viewpoint, use of the base frequency allows simple mixing to baseband to be achieved with sampled data at a frequency of four times the base IF frequency (e.g. 4*1.728 MHz in DECT). In fact, in relation to DECT, data at this rate (i.e. 6.912 MHz) is exactly six times the DECT symbol rate (of 1.152 MHz) and so demodulation of the data can be achieved with a single clock structure, as will readily be appreciated.

The selection of any IF frequency between 0.5*1.728 MHz and 1.728 MHz will allow a performance that lies somewhere between the two cases mentioned above. It should be noted, however, that the choice of frequency is principally limited by the requirement to generate a mixer frequency used to convert the RF signal in the first place and also the frequency required to sample the signal during analog to digital conversion. Furthermore, the subsequent demodulation of the signal in the digital domain also relies on having key frequencies present, as will readily be appreciated, and so it is desirable that a local oscillator responsible for generating the selected IF is also readily able to generate these other frequencies required for effective demodulation and information recovery.

The choice of a 1.728 MHz IF allows simple generation of the mixer signals with an integer N phase locked loop (especially in relation to DECT since all channels lie on integer multiples of a basic 1.728 MHz). The choice of a half channel offset, can still be accommodated in an integer N phase locked loop, but the reference frequency of 0.5*1.728 MHz (i.e. 0.864 MHz) doubles the difficulty in obtaining fast settling times for the loop. Furthermore, although a half channel spacing for the IF yields DC offsets that are very close to the band (and hence difficult to isolate), a half channel spacing places less of a demand on the image rejection of the mixer than a full (unitary) channel spacing for the IF.

Figure 3:
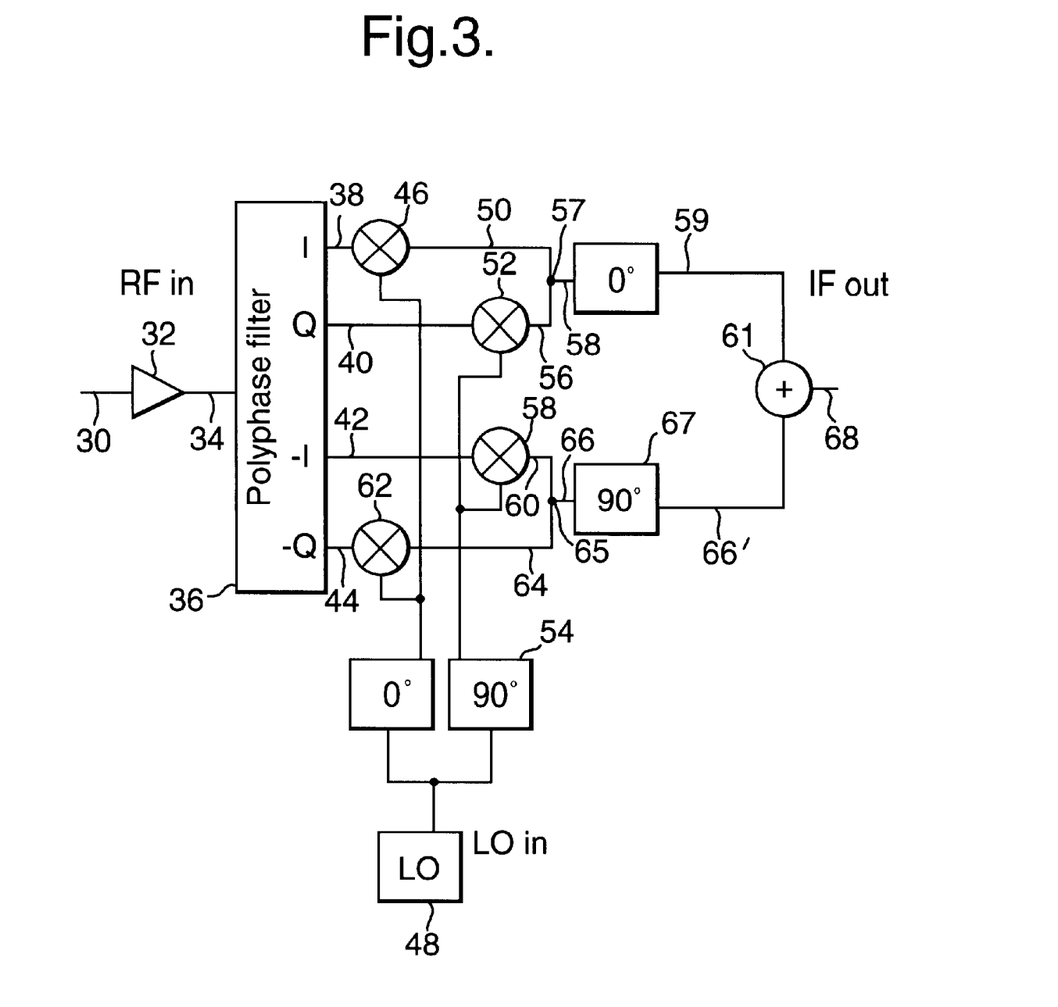
FIG. 3 is a block diagram of an image reject mixer according to a second aspect of the present invention.

In a second aspect of the present invention there is provided an improved image reject mixer, as shown in FIG. 3. A received RF signal is applied to an amplifier 32 to boost its amplitude to a level that facilitates subsequent signal processing. An amplified version 34 of the RF signal is then applied to a polyphase filter 36 that produces two pairs of in-phase and quadrature signal paths, namely in-phase outputs 38 and 42 and quadrature outputs 40 and 44. However, with respect to the pairs of in-phase and quadrature signals, one of the pairs will be an inverted representation of the other. In other words, the RF input is split into actual and inverted in-phase and quadrature components and the signal power is split into four mixers; this arrangement reduces the sensitivity of the image rejection to phase errors in the local oscillator.

Considering now the structure of a first pair of in-phase and quadrature paths 38–40, a first mixer 46 is coupled to a first in-phase output from the polyphase filter 36. The first mixer 46 is further coupled to receive an in-phase reference frequency from a local oscillator 48, which in-phase reference frequency is used to generate a first IF component 50 at an output from the first mixer 46. A second mixer 52 is coupled to a first quadrature output from the polyphase filter 36. The second mixer 52 is further coupled to receive quadrature phase reference frequency from the local oscillator 48 (via a phase delay circuit 54), which quadrature reference frequency is used to generate a second IF component 56 at an output from the second mixer 52. A first adder is positioned at a first summation node 57. The first adder acts to sum together constructively the first IF component 50 and the second IF component 56 to produce a first resultant signal 59 in which a sideband has effectively been destroyed. It will be readily appreciated by the skilled addressee that trigonometric analysis can be employed to verify cancellation of the image signal, with the analysis based on the addition of the phase components of the local oscillator reference frequency and the radio frequency signals at each mixer. The first resultant signal 59 is then applied to a first input of a summation unit 61.

In the second pair of in-phase and quadrature paths 42–44, a third mixer 58 is coupled to a second (inverted) in-phase output from the polyphase filter 36. The third mixer 58 is further coupled to receive the quadrature phase reference frequency from the local oscillator 48 (via a phase delay circuit 54), which quadrature reference frequency is used to generate a third IF component 60 at an output from the third mixer 58. A fourth mixer 62 is coupled to a second (inverted) quadrature output from the polyphase filter 36. The fourth mixer 62 is further coupled to receive the in-phase reference frequency from the local oscillator 48, which quadrature reference frequency is used to generate a fourth IF component 64 at an output from the fourth mixer 62. Although not shown, a second adder is positioned at a second summation node 65. The second adder acts constructively to sum together the third IF component 60 and the fourth IF component 64 to produce a second resultant signal 66 in which a sideband has effectively been destroyed; this will again be readily appreciated from trigonometric analysis.

The second resultant signal 66 is then subjected to a phase rotation through ninety degrees (in phase rotator 67) and then it is applied to a second input of the summation unit 61 that sums together the first resultant signal 59 and the phase altered second resultant signal 66' to produce a composite IF output signal 68. At this point, any image signal is cancelled whilst the wanted signal constructively combines.

Although the two paths have been described as having either no phase rotation or a ninety degree phase rotation it will be appreciated that it is only significant that a ninety degree phase difference exists at appropriate points between the two paths. As such, the respective paths could have a forty-five degree phase lead and a forty-five degree phase lag applied to the respective in-phase and quadrature components.

Figure 4:
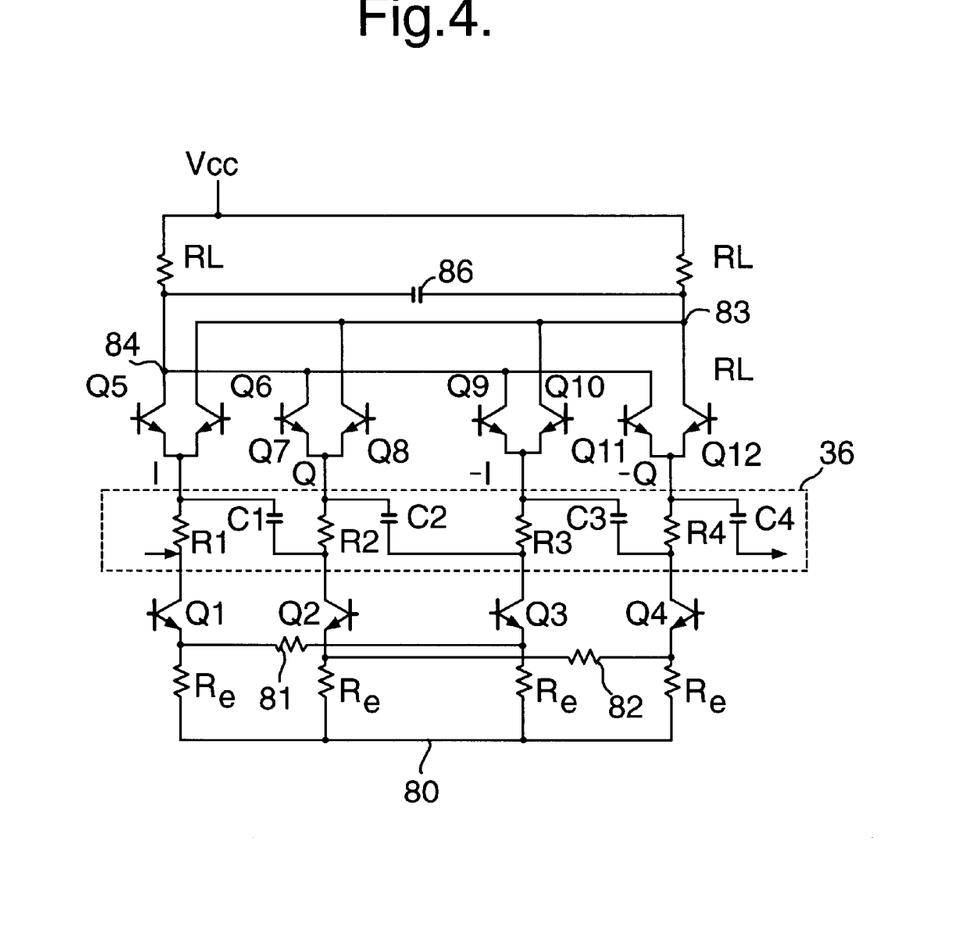
FIG. 4 is a detailed circuit diagram of a mixer circuit according to a preferred embodiment of the present invention, which mixer circuit forms part of the image reject mixer of FIG. 3.

The second aspect of the present invention is, in one respect, concerned with the provision of an improvement to the quadrature of the RF signal and as experienced in relation to the mixers in each pair of paths; this is detailed in FIG. 4. It will be appreciated that the concept of gain matching is shared by all well designed integrated mixers and that the phase rotation method used in the IF is also used in conventional image reject mixers (in general). In general, implementation of an improved image reject mixer is performed in two blocks; one block generates the first 50 and second 56 IF components to be fed into the first adder whilst another block provides third 60 and fourth 64 IF components to be applied to the second adder. FIG. 4, in fact, shows the configuration of only one such mixer block.

Actual and inverted RF signals are applied selectively to one of four mixer paths (to be described in detail subsequently), with the principal difference between each of the four mixer paths being that each path varies from any other path by a phase angle that is an integer multiple of ninety degrees, e.g. the paths have relative phases of $0\pi$, $90\pi$, $180\pi$ and $270'$.

Signal input transistors Q1 and Q3 and signal input transistors Q2 and Q4 each form differential transconductors whose purpose is to convert incident RF signal voltages to a current. Each signal input transistor, realized in bipolar technology for this exemplary embodiment, has an emitter that is coupled through a biasing resistor $R_o$ to a common reference point 80. Each collector of each signal input transistor Q1–Q4 is coupled in series through a resistor R1 to R4, respectively. The values of R1 to R4 are nominally identical. Similarly, the physical locations of each of the resistors R1 to R4 are localized on the semiconductor, while they have substantially identical alignment; all these considerations attempt to eliminate mismatches between the respective mixer paths and are realized by practices known to the skilled addressee.

The emitter terminals of the signal input transistors Q1 and Q3 are coupled together through a de-generation resistor 81, while the emitter terminals of the signal input transistors Q2 and Q4 are coupled together through a second de-generation resistor 82.

Multiplexing mixers, comprised from parallel mirrored-pairs of transistors (namely Q5 and Q6, Q7 and Q8, Q9 and Q10, Q11 and Q12), are respectively coupled to one of the resistors R1 to R4 at an end remote to differential transconductors. Each transistor mixer pair, in fact, is coupled to the respective resistor R1 to R4 through its emitter terminal. A capacitor C1 to C4 is coupled to an intervening circuit node between a respective resistor R1 to R4 and the emitter terminals of the transistor mixer pair, which capacitor C1 to C4 is further coupled to an adjacent mixer path at a point intermediate between the respective resistors R1 to R4 and the collector of a respective signal input transistor Q1 to Q4. The capacitor C1 to C4 are nominally of equal value and are positioned in aligned proximity to one another in order to avoid mismatches within the circuit. The resistors R1 to R4 and capacitor C1 to C4 cooperate to form the polyphase filter 36 and, as such, their circuit geometry produces a wrap-around arrangement wherein a capacitor C4 in the fourth mixer path is coupled to the resistor R1 in the first mixer path.

Returning now to the structure of the multiplexing mixers, the collectors of transistors Q6, Q8, Q10 and Q12 are coupled to a first common point 83, while the collectors of transistors Q5, Q7, Q9 and Q11 are coupled to a second common point 84. A shunt capacitor 86 is coupled between the first common point 83 and the second common point 84. Respective terminals of the shunt capacitor 86 actually provide a tap to the in-phase and quadrature components output from each mixer pair. In other words, the second IF component 56 is viewed at the terminal of the shunt capacitor 86 that is coupled to the first common point 83 while the first IF component 50 is viewed at the terminal of the shunt capacitor 86 that is coupled to the second common point 84. A load resistance RL is also coupled between the first common point 83 and the second common point 84, which load resistance $R_L$ is parallel with the shunt capacitor 86. A supply voltage $V_{cc}$ is provided to the first and second common points (83–84) through the load resistance $R_L$.

The reference frequency provided by the local oscillator 48 and the relative phase of this reference frequency is provided (on a selective basis) to the bases of each transistor in each transistor mixer pair is described in the table below. Also, the RF signal connection (i.e. the modulated carrier used as an input to the image reject mixer) to the signal input transistors Q1 to Q4 is also detailed in the table immediately below.

| Base of Transistor # | Base connection to |
| --- | --- |
| Q1 | RF +ve |
| Q2 | RF −ve |
| Q3 | RF −ve |
| Q4 | RF +ve |
| Q5 | LO cosine +ve |
| Q6 | LO cosine −ve |
| Q7 | LO sine −ve |
| Q8 | LO sine +ve |
| Q9 | LO cosine −ve |
| Q10 | LO cosine +ve |
| Q11 | LO sine +ve |
| Q12 | LO sine −ve |

In relation to the provision of the RF signal and its conversion to a current, it will be appreciated that the voltage across the first de-generation resistor 81 (and the second de-generation resistor 82) is a mirror of the transistor voltages that appear between the bases of Q1 and Q3 (and across Q2 and Q4 in the case of the second de-generation resistor 82). As such, the current flowing through each feed resistor is directly proportional to the input voltage of the applied RF signal. Consequently, the current flowing through each feed resistor flows through the collector of input signal transistor Q1 to Q4 and hence into the respective branches of the polyphase filter 36. The collector outputs of signal input transistors Q1 to Q4 therefore provide the required high impedance drive for a current mode polyphase filter.

As indicated, the combination of resistors R1 to R4 and capacitors C1 to C4 form the polyphase filter 36 which passes in-phase and quadrature currents to the respective transistor mixer pairs within each of the four mixer paths. In fact, the four branches in the polyphase filter 36 each ensure that an appropriately phased drive current having a substantially constant level is applied to the emitter terminals of each mirrored-pair of transistors of each mixer. More specifically, the high impedance path presented by the capacitor C1 to C4 (in each branch of the polyphase filter) to the current flowing through R1 to R4 effectively means that all current flowing through the resistor in each polyphase filter branch is communicated to the emitters in the mixer. Indeed, transistors Q5 to Q12 of the mixers act to present the required low impedance to the output of the polyphase filter, with one transistor of each pair always switched on.

In contrast to a conventional quadrature mixer, the outputs of signal input transistors Q1 to Q4 pass through a polyphase filter 36 and then directly to the mirrored-pairs of transistors Q5 to Q12 in the mixers; no buffering is required between the polyphase filter and either the signal input transistors Q1 to Q4 or the mirrored-pairs of transistors Q5 to Q12. In other words, a complete level of polyphase filtering has been introduced into the image reject mixer IC without adding any mismatch or excess current consumption which would otherwise be present if a separate buffered polyphase filter stage was used. Consequently, improved quadrature is attained at each of the mixers by virtue of the improved polyphase filter function acquired by direct integration of the polyphase filter into the IC.

Advantageously, the polyphase filter 36 is now beneficially current driven (rather than voltage driven), and no extra components (such as required for buffering) are required in the integration of the polyphase filter. Consequently, with the elimination of the requirement for additional current draining and voltage draining components, the circuit design and implementation cost of an image reject mixer in a semiconductor technology are simplified and reduced, respectively.

Some compromise is made in relation to direct polyphase filter integration, i.e. the dc current in the mixer will cause a voltage drop across resistors R1 to R4 which in turn reduces the overall voltage swing available within a given power supply. However, this compromise represents a minor and generally insignificant change with respect to the operating specification of the image reject mixer in its entirety.

Furthermore, by employing the improved architecture of FIG. 4, a good amplitude match between the in-phase and quadrature currents is obtained at the centre frequency for the polyphase filter (i.e. where $2\pi fCR=1$).

As is the case with a conventional quadrature mixer, the in-phase and quadrature mixer outputs provide currents that can be summed directly into the load resistors RL. The load resistors RL are shunted by the shunt capacitor 86 which acts to reduce the amplitude of any spurious high frequency mixing terms and allows the available output voltage range to be completely occupied by the wanted IF signal. Furthermore, this quadrature mixer scheme adopted in the second aspect of the present invention does implicitly reduce the magnitude of the output by virtue of the elimination of the sum frequency.

As previously indicated, implementation of the image reject mixer requires two circuits (or blocks); one of the actual in-phase and quadrature RF signals and one for the inverted in-phase and quadrature RF signals. In other words, one block generates in-phase IF while the other block generates quadrature phase IF. For good image rejection, it is important that these two blocks match one another. In part, this is achieved by standard techniques in which, for example, biasing resistors $R_e$ in the emitter circuit of signal input transistors Q1 to Q4 are constructed identically and in close proximity on the integrated circuit, as previously described.

Figure 5:
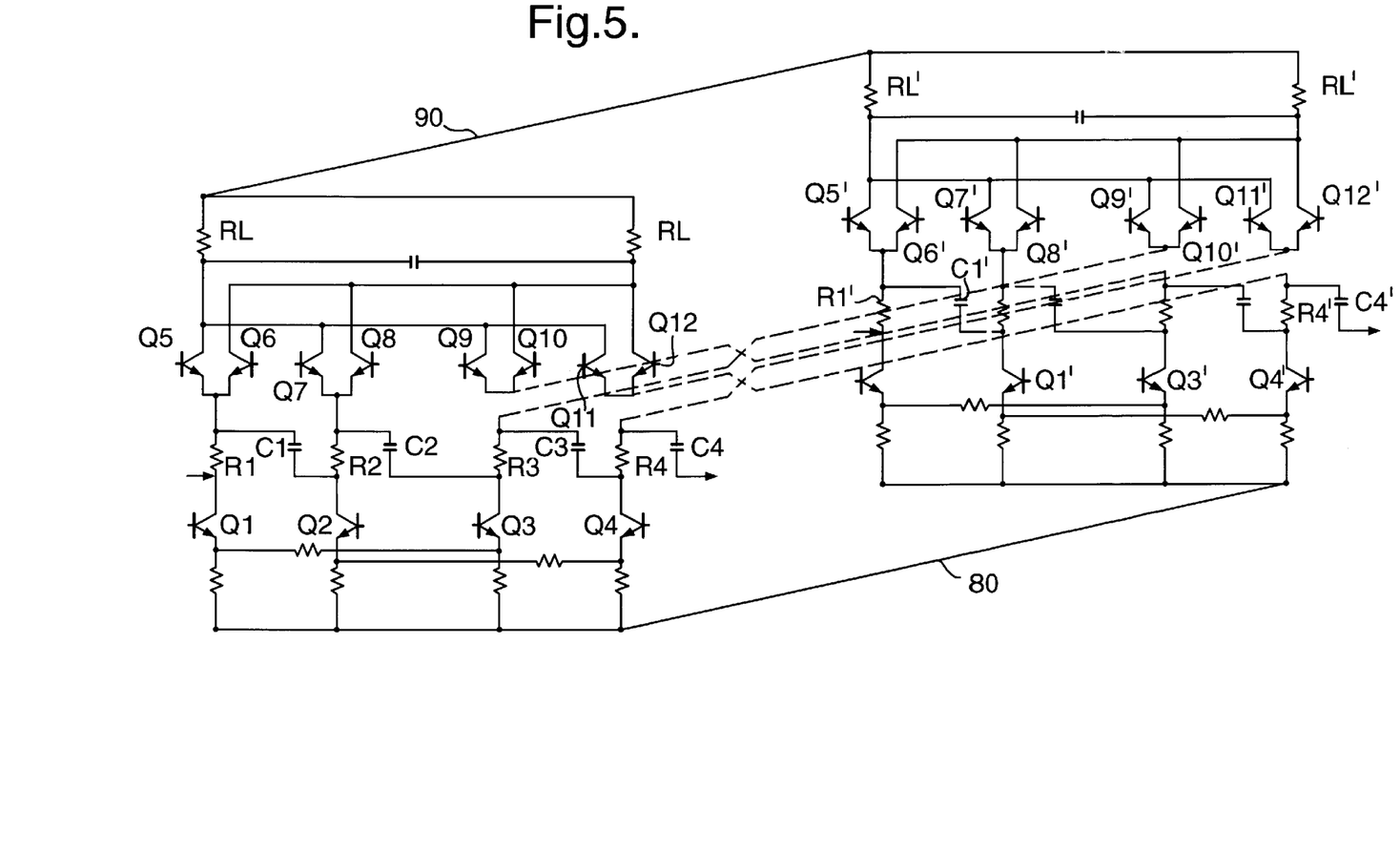
FIG. 5 is a detailed circuit diagram showing cross-coupling of a plurality of the mixer circuits of FIG. 4.

A preferred embodiment of the second aspect of the present invention ensures that the output of the polyphase filter 36 is the same for both mixer blocks. FIG. 5 proposes (and shows) how cross-coupling of the two mixer blocks can be achieved and thus how remaining imbalance in the circuitry can be further reduced. As can be seen from FIG. 5, the general construction of each mixer block is identical to FIG. 4, although the outputs of the respective polyphase filters (above transistors Q3 and Q4 and Q3' and Q4') are fed between the two mixer blocks. Specifically, the current present at the Q3 output is fed to the emitter terminals of the Q9' and Q10' mirrored pair, while the current present at the Q3' output is fed to the emitter terminals of the Q9' and Q10' mirrored pair. The same cross-coupling arrangement occurs in relation to the current present at the Q4 output that is therefore fed to the emitter terminals of the Q11' and Q12' mirrored pair, while the current present at the Q4' output is fed to the emitter terminals of the Q11' and Q12' mirrored pair. Beneficially, cross-coupling has the advantage of correlating the noise generated in transistor Q1 to Q4 and Q1' to Q4' between the two blocks and therefore allows their noise components at the image frequency to be rejected. Putting this another way, the exchange of information between the blocks provides an averaging function that eliminates mismatches between physically separate mixers.

Furthermore, some minor circuit cross-connects are required between the separate blocks shown in FIG. 5. Specifically, there is a shared common reference point 80 between both mixer blocks, and there is a cross-connect 90 between the load resistor RL.

In the preferred embodiment, the circuit is focussed on a bipolar implementation since bipolar devices provide the necessary speed to allow efficient mixing at frequencies in the low giga hertz region. Precise mixing in a bipolar technology does, however, require the commutation of analogue currents and this leads naturally to the current based implementation of the quadrature generating polyphase filter of FIGS. 3 to 5.

Figure 6:
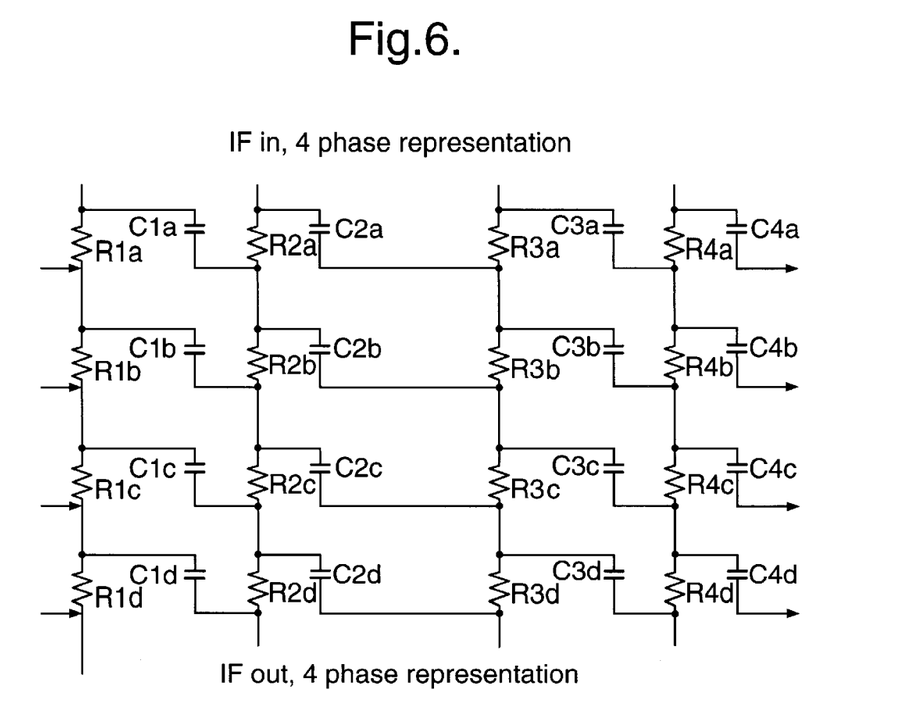
FIG. 6 shows a cascaded structure of polyphase filters employed within FIGS. 4 or 5.

As will be understood, the filtering of positive frequencies from negative frequencies can be achieved using an IF polyphase filter. The basic polyphase filter, however, only effects filtering fully at one frequency. In a real radio system, the filtering must necessarily be good over the whole signal bandwidth. Another embodiment of the present invention therefore proposes cascading several banks of IF polyphase filters and in which each IF polyphase filter has its centre frequency offset from its predecessor's so that together the nulls span the frequency range of interest. This concept of cascaded IF polyphase filters is shown in FIG. 6. Basically, each IF polyphase filter is realised as a wrapped-around chain of resistor-capacitor (RC) combinations in which each resistor and each capacitor within a particular filter is nominally identical in value. However, the values of these capacitors and/or resistors in adjacent and successively coupled IF polyphase filters varies to select a different centre frequency for the IF polyphase filter. Coupling between each IF polyphase filter is then achieved from simply series connections of corresponding resistors in each IF polyphase filter, i.e. $R1_a$ is coupled to $R1_b$ which is coupled to $R1_c$. Of course, one must also take into account any loading between adjacent IF polyphase filter levels (and any added noise). The cascaded arrangement of IF polyphase filters can still be driven directly from the load resistors $R_L$.

The single level of IF polyphase filtering offered by FIGS. 4 and 5 restricts (to some extent) the frequency band over which good quadrature and amplitude balance of the RF signal can be achieved. Higher performance can, however, be achieved if the bases of signal input transistors Q1 and Q3 can be driven with a signal which is initially in quadrature to that at bases of the signal input transistors Q2 and Q4.

Figure 7:
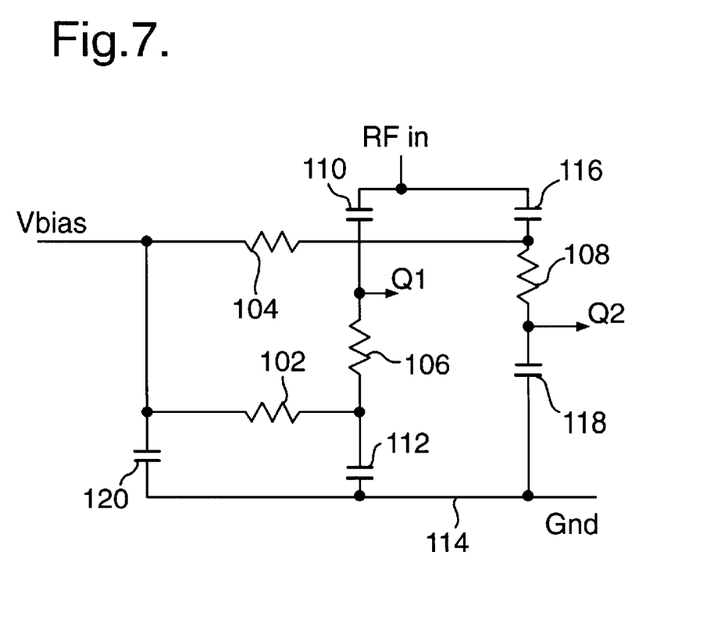
FIG. 7 is a preferred circuit architecture of a biasing circuit.

FIG. 7 provides a preferred circuit architecture of a biasing circuit 100. The circuit 100 provides a means of biasing, for example, signal input transistors Q1 and Q2 for each block. Specifically, the circuit 100 enables dc bias to be fed to the bases of the input signal transistors while allowing the RF signal to be AC coupled and quadrature split from a low impedance source (such as an emitter-follower stage). Clearly, the signal input transistors Q3 and Q4 can be biased from a similar block fed, although the RF signal phase is opposite.

A biasing voltage ($V_{bias}$) is supplied to the bases of transistors Q1 and Q2 through separate circuit paths comprising a series combination of a first resistor 102–104 (having a nominal value of 2 kΩ) and a second resistor 106–108 (having a nominal value of 400 Ω). In the case of input signal transistor Q1, the RF signal ($Rf_{in}$) is coupled to its base through a very low value first capacitor 110 (having a nominal capacitance of 215 femtofarads (215 fF)), which first capacitor 110 is therefore also in a consecutive series chain with the base of Q1, the second resistor 106 and a first ac blocking capacitor 112 (having a nominal value of about 2 picofarads (2 pF)) and a ground plane 114. The RF signal ($Rf_{in}$) is further coupled to the base of input signal transistor Q2 through a second ac blocking capacitor 116 (having a nominal value of about 2 pF) and then through the second resistor 108 and into the base of transistor Q2. The base of transistor Q2 is also coupled to the ground plane 114 through a third ac blocking capacity 118 (having a nominal value of about 215 fF). A fourth ac blocking capacitor 120 is coupled between $V_{bias}$ and the ground plane 114, which fourth ac blocking capacitor 120 (of 2 pF) is in parallel to the first ac blocking capacitor 112.

Since the RF signal to the base of Q1 base is fed via a 215 fF capacitor to the 400 Ω resistor, a forty-five degree phase advance at 1.9 GHz is provided by the path (in view of the path containing a high pass filter). In contrast, the RF signal at the base of Q2 is fed via a 400 Ω resistor to a 215 fF capacitor (that form a low pass filter) and thus provides a forty-five degree phase lag at 1.9 GHz. The ac blocking capacitors are chosen to be sufficiently large so as to be regarded as a short circuit at RF frequencies; they are required only to isolate the bias supply. This circuit improves the frequency range over which good quadrature is achieved without adding significantly to the number of components which would be required to bias and RF feed the circuit without quadrature generation.

In summary, FIG. 7 provides an RF feed stage to the image reject mixer of FIGS. 4 to 6 and improves isolation of the various input stages (i.e. the circuit attempts to prevent stage interaction between the (four) mixer paths). Generally, component value selection provides the required RF input to the input signal transistors Q1 to Q4 and, as such, generally removes unwanted frequency components to an adequately acceptable level.

Figure 8:
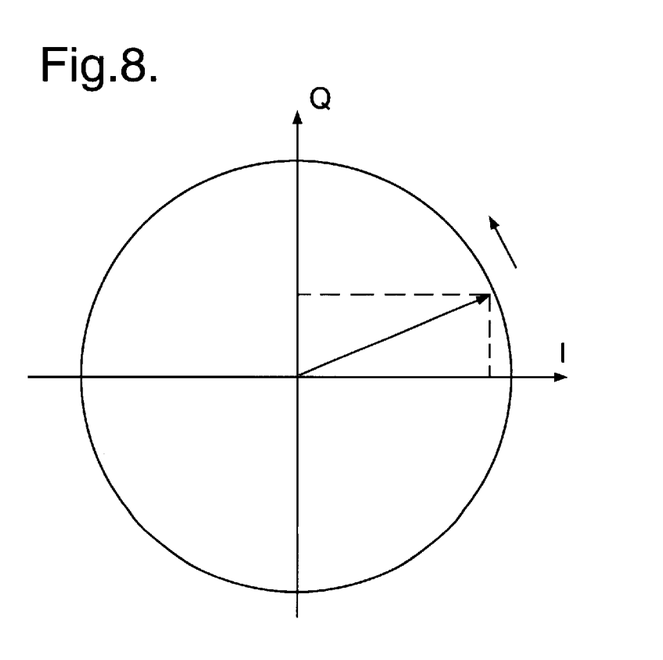
FIG. 8 is a phasor diagram for a quadrature signal.

Finally, as will be understood, the final IF output 68 of FIG. 3 is generated from both in-phase 59 and a quadrature 66' terms. If the input signal to the mixer were to be a pure cosine signal then the in-phase (I) signal would be a cosine and the quadrature (Q) signal a sine. The value of this representation is that it enables positive frequencies to be distinguished from negative ones through the phase relationship of I and Q signals. This is illustrated in FIG. 8 in which the I and Q signals are represented by the projections of a rotating phasor on orthogonal axes.

If the phasor is rotating anti-clockwise then the in-phase signal is at its maximum and the Q signal (beginning at zero) gradually becomes more positive. In contrast, for a clockwise rotating signal, the Q signal (beginning at zero) gradually becomes more negative. This property of a quadrature representation therefore allows a distinction to be drawn between the wanted and image signals that are placed either side of the zero frequency after mixing.

The various aspect of the present invention therefore provide an ability to increase circuit integration and therefore assist manufacturers in their quest to reduce bit- (and particularly) chip-count. Moreover, with integration of the polyphase filter directly into each mixer path (in an IC, for example), improved quadrature to the multiplexing mixers is achieved. Furthermore, with implementation of the image reject mixer in a current driven mode, portable radio communication equipment benefits from a more effective utilization of the battery powered supply.

It will, of course, be appreciated that the above description has been given by way of example only and that modifications in details may be made within the scope of the present invention. For example, while the preferred embodiment of the second aspect of the present invention has been described in relation to a bipolar implementation, it will be appreciated that other semiconductor technologies are also applicable, e.g. metal oxide semiconductor (MOS) technology. Clearly, in this latter instance, it would be preferably to retain current mixing as opposed to the optional voltage mixing allowed in MOS. Furthermore, it will be appreciated that the selection on npn-type bipolar devices is merely by way of example and that pnp-based connection is also contemplated within the scope of the present invention.

We claim:

1. An integrated image reject mixer circuit responsive to an information-bearing signal and arranged to be coupled to a local oscillator that provides phase-referenced signals thereto and wherein the information-bearing signal has in-phase and quadrature components, the integrated image reject mixer circuit comprising:

circuit arrangements of first, second, third, and fourth mixer paths; each circuit arrangement containing:

a signal input for receiving the information-bearing signal;

a mirrored pair of mixer transistors for receiving selected phase-referenced signals, each mirrored pair of mixer transistors further configured to receive a dedicated phase aligned information-bearing signal for frequency down conversion to a respective intermediate frequency component through mixing with one of the selected phase-referenced signals;

a polyphase filter comprising a wrapped chain of individual resistor-capacitor combinations in which a resistor of each phase is coupled between the respective signal input of each phase and a particular mirrored pair of mixer transistors and a capacitor of each phase is coupled from a first circuit node, located between said resistor and said particular mirrored pair of mixer transistors, and a second circuit node located between a different signal input and a different resistor in a phase adjacent mixer path, the polyphase filter being integrally formed directly between the signal inputs and the mirrored pairs of mixer transistors of each of the first, second, third, and fourth mixer paths; such that the phase aligned information-bearing signals in each of the respective first, second, third, and fourth mixer paths; are generated within each mixer path and have a substantially quadrature phase shift therebetween, the integrated image reject mixer circuit further including:

a mirrored pair of circuit arrangements;

a plurality of cross-connections that provide a circuit balancing communication between the mirrored pair of circuit arrangements; and first and second cross-connections that cross-feed corresponding phases of respective polyphase filters of each of the mirrored pair of circuit arrangements, and wherein said corresponding phases support an in-phase and a quadrature phase having phase angle adjacency.

2. The integrated image reject mixer circuit of claim 1, further comprising a biasing circuit for providing the incident information-bearing signal to the plurality of mixer paths, the biasing circuit comprising:

a signal input for receiving the information-bearing signal;

an in-phase output coupled to the signal input through a first capacitor of relatively low capacitance, the in-phase output further coupled to a voltage reference point through a first resistor of relatively low resistance;

a quadrature output coupled to the signal input through a second resistor nominally having the relatively low resistance, the quadrature output further coupled to the voltage reference point through a second capacitor nominally having the relatively low capacitance; and a biasing voltage generator providing a biasing voltage to the in-phase output and the quadrature output via, respectively, third and fourth resistors coupled directly in series to the first resistor and the second resistor, respectively, and wherein the third and fourth resistors have a relatively high resistance;

whereby the biasing circuit isolates the plurality of paths in the image reject mixer and supports AC coupling and quadrature splitting of the information-bearing signal from a low impedance source.

3. The integrated image reject mixer circuit of claim 1, wherein the phase-referenced signal applied to each mirrored pair of mixer transistors has a frequency such that mixing with the information-bearing signal forms an intermediate frequency signal having a frequency offset relative to DC that is in an approximate range of between a half channel spacing and a single channel spacing.

4. The integrated image reject mixer circuit of claim 1, wherein each signal input to each mixer path is provided through an input transistor having one of its terminals coupled to a shared common reference through a biasing resistor.

5. The integrated image reject mixer circuit of claim 4, further including:

a first de-generation resistor coupled between said one of respective input transistor terminals of in-phase mixer paths; and a second de-generation resistor coupled between said one of respective input transistor terminals of quadrature mixer paths;

the first feed resistor and the second feed resistor providing means for generating a drive current proportional to a time varying amplitude of the information-bearing signal applied to each input transistor of each mixer path.

6. The integrated image reject mixer circuit of claim 1, wherein each mirrored pair of mixer transistors comprises a first output terminal and a second output terminal, and wherein each first output terminal of each mixer path is coupled to a first common point and each second output terminal of each mixer path is coupled to a second common point.

7. The integrated image reject mixer circuit of claim 6, further comprising a shunt capacitor coupled between the first common point and the second common point.

8. The integrated image reject mixer circuit of claim 7, further comprising a load resistance coupling the first common point and the second common point to a supply.

9. The integrated image reject mixer circuit of claim 1, further comprising a plurality of stacked polyphase filters each having differing and offset centre frequencies.

10. An integrated image reject mixer circuit responsive to an information-bearing signal and arranged to be coupled to a local oscillator that provides phase-referenced signals thereto and wherein the information-bearing signal has in-phase and quadrature components, the integrated image reject mixer circuit comprising:
circuit arrangements of first, second, third, and fourth mixer paths each circuit arrangement containing:
a signal input for receiving the information-bearing signal;
a mirrored pair of mixer transistors for receiving selected phase-referenced signals, each mirrored pair of mixer transistors further configured to receive a dedicated phase aligned information-bearing signal for frequency down conversion to a respective intermediate frequency component through mixing with one of the selected phase-referenced signals; and
a polyphase filter integrally formed directly between the signal inputs and the mirrored pairs of mixer transistors of each of the first, second, third, and fourth mixer paths such that the phase aligned information-bearing signals in each of the respective first, second, third, and fourth mixer paths are generated within each mixer path and have a substantially quadrature phase shift therebetween; the integrated image reject mixer circuit further comprising a biasing circuit for providing the incident information-bearing signal to the plurality of mixer paths, the biasing circuit comprising:
a signal input for receiving the information-bearing signal;
an in-phase output coupled to the signal input through a first capacitor of relatively low capacitance, the in-phase output further coupled to a voltage reference point through a first resistor of relatively low resistance;
a quadrature output coupled to the signal input through a second resistor nominally having the relatively low resistance, the quadrature output further coupled to the voltage reference point through a second capacitor nominally having the relatively low capacitance; and
a biasing voltage generator providing a biasing voltage to the in-phase output and the quadrature output via, respectively, third and fourth resistors coupled directly in series to the first resistor and the second resistor, respectively, and wherein the third and fourth resistors have a relatively high resistance;
whereby the biasing circuit isolates the plurality of paths in the image reject mixer and supports AC coupling and quadrature splitting of the information-bearing signal from a low impedance source.

11. The integrated image reject mixer circuit of claim 10, wherein the phase-referenced signal applied to each mirrored pair of mixer transistors has a frequency such that mixing with the information-bearing signal forms an intermediate frequency signal having a frequency offset relative to DC that is in an approximate range of between a half channel spacing and a single channel spacing.

12. The integrated image reject mixer circuit of claim 10, wherein the polyphase filter comprises a wrapped chain of individual resistor-capacitor combinations in which a resistor of each phase is coupled between the respective signal input of each phase and a particular mirrored pair of mixer transistors and a capacitor of each phase is coupled from a first circuit node, located between said resistor and said particular mirrored pair of mixer transistors, and a second circuit node located between a different signal input and a different resistor in a phase adjacent mixer path.

13. The integrated image reject mixer circuit of claim 12, further including a mirrored pair of circuit arrangements, the image reject mixer further including a plurality of cross-connections that provide a circuit balancing communication between the mirrored pair of circuit arrangements.

14. The integrated image reject mixer circuit of claim 13, further including first and second cross-connections that cross-feed corresponding phases of respective polyphase filters of each of the mirrored pair of circuit arrangements, and wherein said corresponding phases support an in-phase and a quadrature phase having phase angle adjacency.

15. The integrated image reject mixer circuit of claim 10, wherein each signal input to each mixer path is provided through an input transistor having one of its terminals coupled to a shared common reference through a biasing resistor.

16. The integrated image reject mixer circuit of claim 15, further including:
a first de-generation resistor coupled between said one of respective input transistor terminals of in-phase mixer paths; and
a second de-generation resistor coupled between said one of respective input transistor terminals of quadrature mixer paths;
the first feed resistor and the second feed resistor providing means for generating a drive current proportional to a time varying amplitude of the information-bearing signal applied to each input transistor of each mixer path.

17. The integrated image reject mixer circuit of claim 10, wherein each mirrored pair of mixer transistors comprises a first output terminal and a second output terminal, and wherein each first output terminal of each mixer path is coupled to a first common point and each second output terminal of each mixer path is coupled to a second common point.

18. The integrated image reject mixer circuit of claim 17, further comprising a shunt capacitor coupled between the first common point and the second common point.

19. The integrated image reject mixer circuit of claim 18, further comprising a load resistance coupling the first common point and the second common point to a supply.

20. The integrated image reject mixer circuit of claim 10, further comprising a plurality of stacked polyphase filters each having differing and offset centre frequencies.

21. An integrated image reject mixer circuit responsive to an information-bearing signal and arranged to be coupled to a local oscillator that provides phase-referenced signals thereto and wherein the information-bearing signal has in-phase and quadrature components, the integrated image reject mixer circuit comprising:
   circuit arrangements of first, second, third, and fourth mixer paths each circuit arrangement containing:
      a signal input for receiving the information-bearing signal;
      a mirrored pair of mixer transistors for receiving selected phase-referenced signals, each mirrored pair of mixer transistors further configured to receive a dedicated phase aligned information-bearing signal for frequency down conversion to a respective intermediate frequency component through mixing with one of the selected phase-referenced signals; and
      a polyphase filter integrally formed directly between the signal inputs and the mirrored pairs of mixer transistors of each of the first, second, third, and fourth mixer paths such that the phase aligned information-bearing signals in each of the respective first, second, third, and fourth mixer paths are generated within each mixer path and have a substantially quadrature phase shift therebetween; wherein each signal input to each mixer path is provided through an input transistor having one of its terminals coupled to a shared common reference through a biasing resistor, further including:
         a first de-generation resistor coupled between said one of respective input transistor terminals of in-phase mixer paths; and
         a second de-generation resistor coupled between said one of respective input transistor terminals of quadrature mixer paths;
         the first feed resistor and the second feed resistor providing means for generating a drive current proportional to a time varying amplitude of the information-bearing signal applied to each input transistor of each mixer path.

22. The integrated image reject mixer circuit of claim 21, further comprising a biasing circuit for providing the incident information-bearing signal to the plurality of mixer paths, the biasing circuit comprising:
   a signal input for receiving the information-bearing signal;
   an in-phase output coupled to the signal input through a first capacitor of relatively low capacitance, the in-phase output further coupled to a voltage reference point through a first resistor of relatively low resistance;
   a quadrature output coupled to the signal input through a second resistor nominally having the relatively low resistance, the quadrature output further coupled to the voltage reference point through a second capacitor nominally having the relatively low capacitance; and
   a biasing voltage generator providing a biasing voltage to the in-phase output and the quadrature output via, respectively, third and fourth resistors coupled directly in series to the first resistor and the second resistor, respectively, and wherein the third and fourth resistors have a relatively high resistance;
   whereby the biasing circuit isolates the plurality of paths in the image reject mixer and supports AC coupling and quadrature splitting of the information-bearing signal from a low impedance source.

23. The integrated image reject mixer circuit of claim 21, wherein the phase-referenced signal applied to each mirrored pair of mixer transistors has a frequency such that mixing with the information-bearing signal forms an intermediate frequency signal having a frequency offset relative to DC that is in an approximate range of between a half channel spacing and a single channel spacing.

24. The integrated image reject mixer circuit of claim 21, wherein the polyphase filter comprises a wrapped chain of individual resistor-capacitor combinations in which a resistor of each phase is coupled between the respective signal input of each phase and a particular mirrored pair of mixer transistors and a capacitor of each phase is coupled from a first circuit node, located between said resistor and said particular mirrored pair of mixer transistors, and a second circuit node located between a different signal input and a different resistor in a phase adjacent mixer path.

25. The integrated image reject mixer circuit of claim 24, further including a mirrored pair of circuit arrangements, the image reject mixer further including a plurality of cross-connections that provide a circuit balancing communication between the mirrored pair of circuit arrangements.

26. The integrated image reject mixer circuit of claim 25, further including first and second cross-connections that cross-feed corresponding phases of respective polyphase filters of each of the mirrored pair of circuit arrangements, and wherein said corresponding phases support an in- phase and a quadrature phase having phase angle adjacency.

27. The integrated image reject mixer circuit of claim 21, wherein each mirrored pair of mixer transistors comprises a first output terminal and a second output terminal, and wherein each first output terminal of each mixer path is coupled to a first common point and each second output terminal of each mixer path is coupled to a second common point.

28. The integrated image reject mixer circuit of claim 27, further comprising a shunt capacitor coupled between the first common point and the second common point.

29. The integrated image reject mixer circuit of claim 28, further comprising a load resistance coupling the first common point and the second common point to a supply.

30. The integrated image reject mixer circuit of claim 21, further comprising a plurality of stacked polyphase filters each having differing and offset centre frequencies.

31. A biasing circuit for providing an incident information-bearing signal to a plurality of paths in an image reject mixer, the biasing circuit comprising:
   a signal input for receiving the information-bearing signal;
   an in-phase output coupled to the signal input through a first capacitor of relatively low capacitance, the in-phase output further coupled to a voltage reference point through a first resistor of relatively low resistance;
   a quadrature output coupled to the signal input through a second resistor nominally having the relatively low resistance, the quadrature output further coupled to the voltage reference point through a second capacitor nominally having the relatively low capacitance; and
   a biasing voltage generator providing a biasing voltage to the in-phase output and the quadrature output via, respectively, third and fourth resistors coupled directly in series to the first resistor and the second resistor, respectively, and wherein the third and fourth resistors have a relatively high resistance;

whereby the biasing circuit isolates the plurality of paths in the image reject mixer and supports AC coupling and quadrature splitting of the information-bearing signal from a low impedance source.

32. The biasing circuit of claim 31, further including an ac blocking capacitor of relatively high capacitance coupled between the signal input and the second resistor.

33. The biasing circuit of claim 31, further including high frequency isolation capacitors coupled between:
   the biasing voltage generator and the voltage reference point; and
   the first resistor and the voltage reference point.

* * * * *